Figure 1:
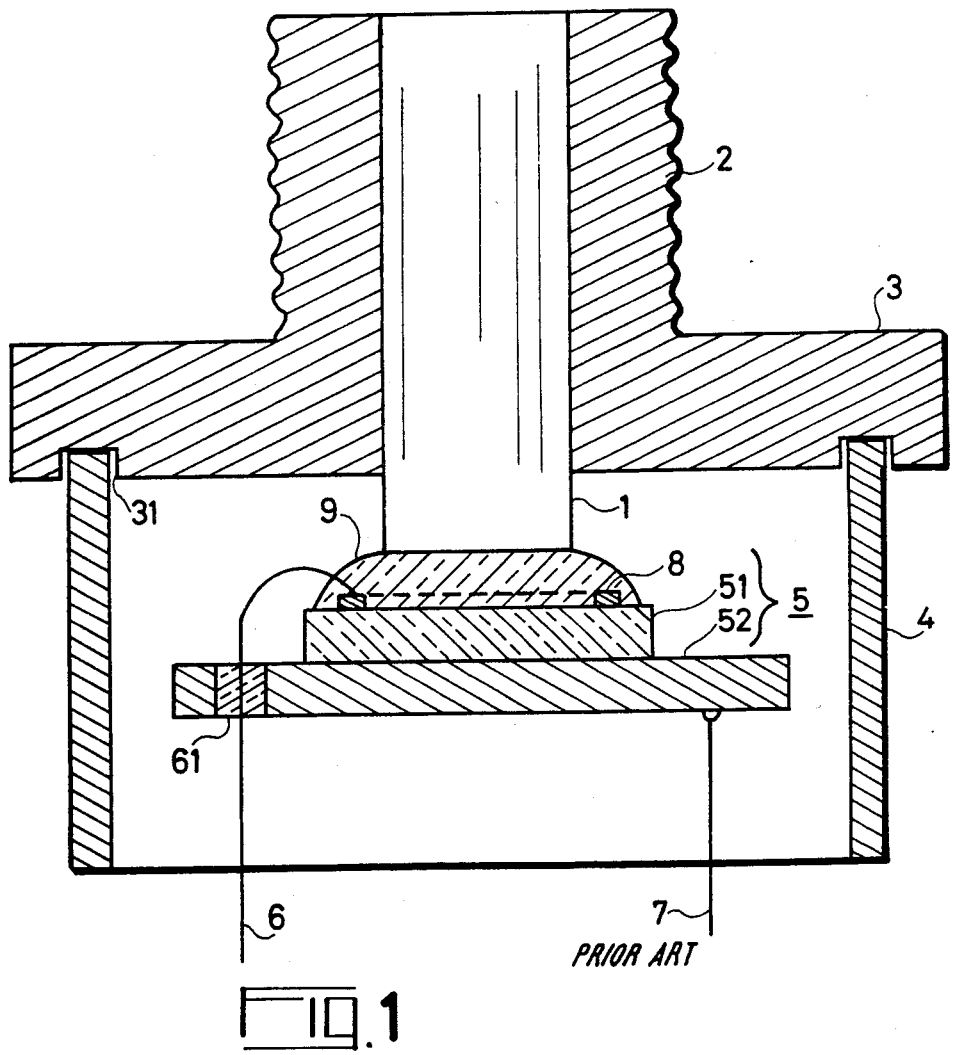

United States Patent [19]

Henry et al.

[11] 4,192,574
[45] Mar. 11, 1980

[54] SEALED ENCLOSING SYSTEM FOR COUPLING AN OPTOELECTRONIC DEVICE AND AN OPTICAL FIBRE

[75] Inventors: Raymond Henry; Jean-Claude Resneau; Jean-Victor Bouvet, all of Paris, France

[73] Assignee: Thomson-CSF, Paris, France

[21] Appl. No.: 895,224

[22] Filed: Apr. 10, 1978

[30] Foreign Application Priority Data

Apr. 13, 1977 [FR] France ............... 77 11061

[51] Int. Cl.² ............................................. G02B 5/14
[52] U.S. Cl. ...................... 350/96.17; 250/227; 350/96.20
[58] Field of Search ............... 350/96.15, 96.17, 96.18, 350/96.20; 250/227

[56] References Cited

U.S. PATENT DOCUMENTS

| 3,423,594 | 1/1969 | Galopin ................. 350/96.20 X |
| 4,042,823 | 8/1977 | Decker et al. ................. 250/227 |
| 4,075,477 | 2/1978 | Hanson ................. 350/96.20 X |
| 4,118,100 | 10/1978 | Goell et al. ................. 350/96.20 |

FOREIGN PATENT DOCUMENTS

| 2067621 | 8/1971 | France . |
| 2313688 | 12/1976 | France ................. 350/96.20 |
| 1449816 | 9/1976 | United Kingdom . |

Primary Examiner—John K. Corbin
Assistant Examiner—John D. Lee
Attorney, Agent, or Firm—Oblon, Fisher, Spivak, McClelland & Maier

[57] ABSTRACT

A sealed enclosing system for coupling an emitting or receiving optoelectronic device with an optical fibre. A metal cap has an optical fibre passing therethrough in a sealed manner. A bellows tube is mounted on a base and thus provides an elastic element for connecting the fibre to an optoelectronic diode mounted on the tube. The seal is completed by a welding of the cap to the base and by passing electric supply connections through the passage ways formed by glass beads.

5 Claims, 3 Drawing Figures

SEALED ENCLOSING SYSTEM FOR COUPLING AN OPTOELECTRONIC DEVICE AND AN OPTICAL FIBRE

The invention relates to a sealed enclosing system for an optoelectronic device such as an electroluminescent emitter or a receiver of the photodiode type using at least one optical fibre for transmitting the light energy.

Various coupling methods are used for emitting in an optical fibre from an electroluminescent diode or for receiving on a detector surface of a photodiode, the light transmitted through an optical fibre. Among the most simple coupling systems there may be mentioned the adhesion of the end of the fibre, which is maintained in a metal sleeve and cut on a cross section, to the photoemitting or photoreceiving surface. In order to consolidate the adhesion it is completed by a coating of resin.

However, none of the known systems has a sealing quality which would, for example, permit good performance in a saline fog or simply in a damp heat.

The invention provides an enclosing system capable of guaranteeing such a good performance owing to its sealing qualities.

According to the invention, there is provided a sealed enclosing system for coupling an optoelectronic device and an optical fibre, comprising a first enclosure having a sealed passageway for an optical fibre and a second enclosure consisting of elastic walls, of a platform destined to support said optoelectronic device, and of a portion of a base common to said first and second enclosures, said second enclosure being located in said first enclosure.

Figure 2:
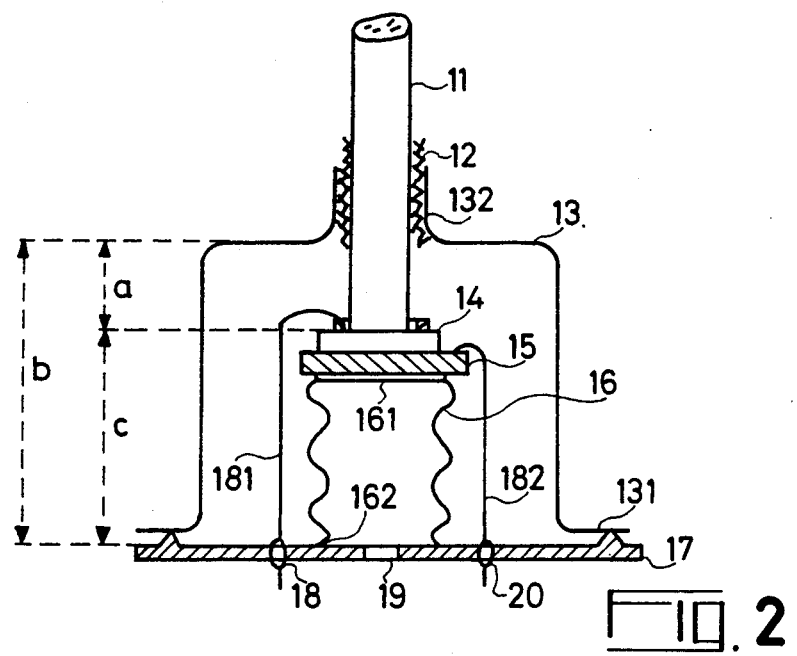
Figure 3:
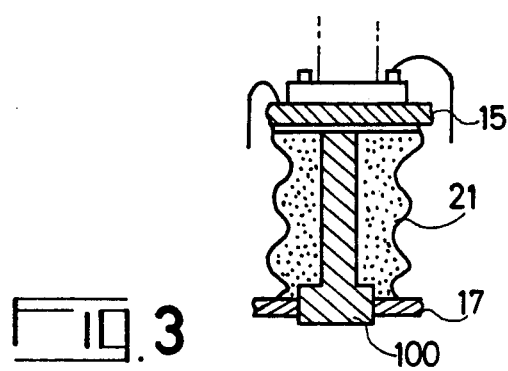

A better understanding of the invention will be had and other features will appear from the ensuing description and the accompanying drawings in which:

FIG. 1 represents the prior art;
FIG. 2 represents an embodiment according to the invention;
FIG. 3 represents a variant of this embodiment.

According to the prior art shown in FIG. 1, a length of fibre 1 is maintained in a metal sleeve 2 connectable by a screwthreaded portion to a female portion of a connector of optical fibre of which only the male part has been shown in FIG. 1. This metal sleeve 2 has a base 3 provided with a circular groove 31 adapted to receive the end of a metal cylinder 4 which defines a housing for an optoelectronic device 5. This device is either an electroluminescent diode or a photodiode. A diode 51 is welded to a metal base 52. Two connecting wires 6 and 7 constitute the electronic input or output of the device. The connection 6 passes through the base 52 owing to the provision of a bead of glass 61 and is connected to the metallized ring 8 bordering the active part of the diode and constituting is polarization electrode. The assembly of the device at the end of the fibre comprises a transparent drop 9 of varnish of any index but having preferably polymerization properties whereby it is possible to maintain after adjustment the optimum value of the distance between the end of the fibre and the diode.

The assembly is consolidated by a sleeve (not shown) of synthetic resin which surrounds and immobilizes the fibrediode connection and by a filling (not shown) of the cylinder 4 with an organic polymer.

The prior arrangement has the drawback of being delicate to assemble industrially without however providing sufficient protection against exceptional atmospheric agents.

In the embodiment of the invention shown in FIG. 2, a first sealed enclosure is formed by a substantially cylindrical metal cap 13 which is wide open at its base and has a flange 131 whereby it can be welded to a base 17. At the top of the cap 13 a mouth 132 is formed as a sealed passageway through the cap for an optical fibre or a bunch of optical fibres. For this purpose there is deposited, for example, a layer 12 of metal which is easy to weld around a fibre 11.

A second sealed enclosure is constituted by a bellows tube or "tombac" (registered mark) 16 having a closed end 161 adapted to act as a support for an optoelectronic device and an open end 162 which is welded to the center of the base 17 which has previously been provided with a central aperture 19.

The first enclosure comprises two passages through glass beads 18 and 20 placed in position in the base 17 for passing through the supply connections 181 and 182 of the optoelectronic device. Those connections are used at the same time for transmitting optoelectronic signals.

The second enclosure is surmounted by the diode 14 after interposition of a disc 15 of alumina or beryllium oxide, the latter having the advantage of being both electrically insulating and heat conducting. The connection 182 is welded to a metallization carried by the disc 15.

The method of manufacturing the enclosing system may comprise for example the following steps:

a first step comprising the fitting up of a first assembly formed by the base 17 and the bellows tube 16 and the diode 14 with its supply connections welded to the passageways 18 and 20;

a second step comprising the fitting up of a second assembly formed by the cap 13 and the fibre 11 welded at 12;

a third connecting step by the welding of the cap 13 to the base 17;

a fourth consolidating step by the introduction of polymerizable resin in the bellows tube by way of the aperture 19.

Let us call a the distance from the diode 14 to the top of the cap 13, which is substantially the same as the distance from the end of the fibre 11 to the top of the cap 13. Let us call b the distance from the base 17 to the top of the cap 13. Let us call c the length of the bellows tube 16. One has the following equality:

$$a+c=b$$

In the assembly only b is fixed; the lengths a and c can vary by compressing the bellows tube 16. The flexibility of this tube prevents any damage of the tip of the fiber 11 at the connecting step (third step).

FIG. 3 shows a part of the enclosing system in case of a modification comprising introducing in the bellows tube a metal member 100 adapted to dissipate heat energy. This member 100 of a heat conductive material is maintained by polymerizable resin 21 which was previously placed in the bellows tube. The member 100 is put in contact with the base which also contributes to the dissipation of the heat which might be considerable in the case of the light emitters.

What we claim is:
1. A sealed system for coupling an optoelectronic device and an optical fiber, comprising:

a first enclosure consisting of a metal cap having, at its top, a sealed passageway for an optical fibre, said cap being welded onto a base;

a second enclosure, located in said first enclosure, consisting of a length of bellows tube closed by a metallic plate at one end and welded to said base at the other end, said base being common to both of said enclosures;

a platform adapted to support said optoelectronic device and being integral with said metallic plate.

2. A system as claimed in claim 1, wherein said common base is bored to allow said second enclosure to be filled by a polymerizable resin.

3. A system as claimed in claim 1, wherein said second enclosure comprises an internal heat dissipator positioned in contact with said base.

4. A system as claimed in claim 1, wherein said common base comprises sealed passageways for conductors adapted to supply the optoelectronic device with electrical polarization and to transmit optoelectronic signals.

5. A system as claimed in claim 1, wherein said platform is supplied with an electrically insulating and thermally conductive disc destined to be inserted between said platform and said optoelectronic device.

* * * * *